United States Patent
Lin

(10) Patent No.: US 11,703,531 B2
(45) Date of Patent: Jul. 18, 2023

(54) CONTACT RESISTOR TEST METHOD AND DEVICE

(71) Applicant: Changxin Memory Technologies, Inc., Anhui (CN)

(72) Inventor: Shih-Chieh Lin, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 53 days.

(21) Appl. No.: 17/491,950

(22) Filed: Oct. 1, 2021

(65) Prior Publication Data
US 2022/0373584 A1 Nov. 24, 2022

Related U.S. Application Data

(63) Continuation of application No. PCT/CN2021/113062, filed on Aug. 17, 2021.

(30) Foreign Application Priority Data

May 20, 2021 (CN) .................. 202110551274.X

(51) Int. Cl.
  *G01R 27/08* (2006.01)
  *G01R 27/20* (2006.01)
  *G01R 31/28* (2006.01)
(52) U.S. Cl.
  CPC ....... *G01R 27/205* (2013.01); *G01R 31/2874* (2013.01)
(58) Field of Classification Search
  CPC .... G01R 27/205; G01R 27/287; G01R 1/067; G01R 1/06711; G01R 31/2621;
  (Continued)

(56) References Cited

U.S. PATENT DOCUMENTS 8,114,686 B2 * 2/2012 Habib ............... H10N 70/8828
                                                     374/21
10,755,990 B2 * 8/2020 Zheng ................ H01L 29/401
(Continued)

FOREIGN PATENT DOCUMENTS

CN     102353885 A    2/2012
CN     106896307 A    6/2017
(Continued)

OTHER PUBLICATIONS

PCT International Search Report and the Written Opinion dated Jan. 25, 2022, issued in related International Application No. PCT/CN2021/113062, with English translation (22 pages).

*Primary Examiner* — Thang X Le
(74) *Attorney, Agent, or Firm* — Sheppard Mullin Richter & Hampton LLP

(57) ABSTRACT

A contact resistance test method and related devices are provided. When a MOS transistor working in a linear region is tested, a functional relationship between the channel width of the MOS transistor and total resistances of the MOS transistor at sampling temperatures is determined, to determine the contact resistance of the MOS transistor at the sampling temperatures. A calibration coefficient of the contact resistance at a current ambient temperature is determined based on the contact resistance of the MOS transistor at the sampling temperatures. A measurement result of the contact resistance is further adjusted based on the calibration coefficient of the contact resistance at the current ambient temperature, to obtain an accurate contact resistance at the current ambient temperature.

20 Claims, 4 Drawing Sheets

(58) Field of Classification Search
CPC ............ G01R 31/2628; G01R 31/2648; G01R 31/27; G01R 31/31919; G01R 31/31926
See application file for complete search history.

(56) References Cited

U.S. PATENT DOCUMENTS

| | | | |
|---|---|---|---|
| 2006/0138560 A1* | 6/2006 | Choi | H01L 29/41725 257/E29.116 |
| 2006/0138582 A1* | 6/2006 | Han | G01K 7/226 257/467 |
| 2008/0030297 A1* | 2/2008 | Ohtsuka | H01L 29/8605 257/E27.047 |
| 2008/0076196 A1 | 3/2008 | Yamaguchi | |
| 2008/0265928 A1 | 10/2008 | Tsuchiya | |
| 2012/0187975 A1* | 7/2012 | Koh | G01R 31/2621 324/762.01 |
| 2013/0054210 A1* | 2/2013 | Chen | G01R 31/2628 703/2 |

FOREIGN PATENT DOCUMENTS

| | | |
|---|---|---|
| CN | 107248496 A | 10/2017 |
| CN | 108170910 A | 6/2018 |

* cited by examiner

CONTACT RESISTOR TEST METHOD AND DEVICE

CROSS-REFERENCE TO RELATED APPLICATION

This application is a continuation application of International Patent Application No. PCT/CN2021/113062, filed on Aug. 17, 2021, which claims priority to Chinese Patent Application No. 202110551274.X, filed with the China National Intellectual Property Administration (CNIPA) on May 20, 2021. The above-referenced applications are incorporated herein by reference in their entirety.

TECHNICAL FIELD

This invention relates generally to the field of semiconductor technologies, and in particular, to a contact resistance test method and device.

BACKGROUND

Metal-Oxide Semiconductor Field Effect Transistors (MOSFET), also referred to as MOS transistors, are basic components in the semiconductor manufacturing process and widely used in various integrated circuits.

In the process of measuring and modeling a MOS transistor, electrical characteristics of the MOS transistor, such as Idsat, Vtlin, Vtsat, and Idlin, need to be accurately measured. In a Dynamic Random-Access Memory (DRAM) manufacturing process, due to the coexistence of the storage unit and the MOS transistor in the peripheral circuit, the MOS transistor may have a relatively high contact resistance, which results in a relatively large parasitic resistance. The parasitic resistance may not be removed during the measurement. Consequently, measurement accuracy is adversely affected, and accurate electrical parameters and component modeling may not be achieved.

In the actual process of measuring the contact resistor, the contact resistance may be affected by various factors, such as the ambient temperature. Therefore, a method to accurately measure the contact resistance to improve the measurement accuracy of the MOS transistor is urgently needed.

SUMMARY

This application first provides a contact resistance test method and related device to accurately measure the resistance of a contact resistor, thereby improving the measurement accuracy of the MOS transistor.

The first aspect of this application provides a contact resistance test method, configured to measure the contact resistance of a MOS transistor working in a linear region. The method includes: determining a functional relationship between a channel width of the MOS transistor and first resistances of the MOS transistor at a plurality of sampling temperatures, wherein the first resistance is the sum of the resistance of the channel resistor (i.e., the channel resistance) and the resistance of the contact resistor (i.e., the contact resistance) of the MOS transistor; determining a respective contact resistance of the MOS transistor at each of the plurality of sampling temperatures based on the functional relationship; determining a calibration coefficient of the contact resistance at a current ambient temperature based on the respective contact resistance of the MOS transistor at each of the plurality of sampling temperatures; and determining a current contact resistance at the current ambient temperature based on the calibration coefficient, a unit area resistance of the contact resistor, and an area of the contact resistor.

The second aspect of this application provides a contact resistance test apparatus, configured to measure the contact resistance of a MOS transistor working in a linear region. The apparatus includes: a first processing module, configured to determine a functional relationship between a channel width of the MOS transistor and first resistances of the MOS transistor at a plurality of sampling temperatures, wherein the first resistance is the sum of the resistance of a channel resistor (i.e., the channel resistance) and the resistance of the contact resistor (i.e., the contact resistance) of the MOS transistor; a second processing module, configured to determine the respective contact resistance of the MOS transistor at each of the plurality of sampling temperatures based on the functional relationship; a first calculation module, configured to determine a calibration coefficient of the contact resistance at a current ambient temperature based on the respective contact resistance of the MOS transistor at each of the plurality of sampling temperatures; and a second calculation module, configured to determine a current contact resistance at the current ambient temperature based on the calibration coefficient, a unit area resistance of the contact resistor, and an area of the contact resistor.

The third aspect of this application provides an electronic device. The electronic device includes at least one processor and a memory. The memory stores computer-executable instructions. Upon being executed by the at least one processor, the computer-executable instructions cause the at least one processor to perform the contact resistance test method provided in the first aspect.

The fourth aspect of this invention provides a computer-readable storage medium. The computer-readable storage medium stores computer-executable instructions. When a processor executes the computer-executable instructions, the contact resistance test method provided in the first aspect is implemented.

The fifth aspect of this invention provides a computer program product, including a computer program. When the computer program is executed by a processor, the contact resistance test method provided in the first aspect is implemented.

According to the contact resistance test method and device provided in the embodiments of this application, when the contact resistance of the MOS transistor working in the linear region is measured, the functional relationship between the channel width of the MOS transistor and the first resistance of the MOS transistor at the plurality of sampling temperatures is determined to determine the contact resistance of the MOS transistor at each of the plurality of sampling temperatures. The calibration coefficient of the contact resistance at the current ambient temperature is determined based on the respective contact resistance of the MOS transistor at each of the plurality of sampling temperatures. A measurement result of the contact resistance is further adjusted based on the calibration coefficient of the contact resistance at the current ambient temperature to obtain an accurate contact resistance at the current ambient temperature. This method effectively eliminates the adversarial impact generated by the fluctuation of the ambient temperature and the parasitic effect of the contact resistance, thereby improving the measurement accuracy of the MOS transistor.

BRIEF DESCRIPTION OF THE DRAWINGS

To describe the technical solutions in the embodiments of this application more clearly, the following briefly describes the accompanying drawings required for describing the embodiments of this application. Apparently, the accompanying drawings in the following description show only some embodiments of this application, and a person of ordinary skill in the art may derive other drawings from these accompanying drawings without creative efforts.

DETAILED DESCRIPTION OF THE EMBODIMENTS

To make the objectives, technical solutions, and advantages of the embodiments of this application clearer, the following clearly and completely describes the technical solutions in the embodiments of this application with reference to the accompanying drawings in the embodiments of this application. Apparently, the described embodiments are some rather than all of the embodiments of this application. Based on the embodiments of this application, all other embodiments obtained by a person of ordinary skill in the art without creative efforts fall within the protection scope of this application.

Figure 1:
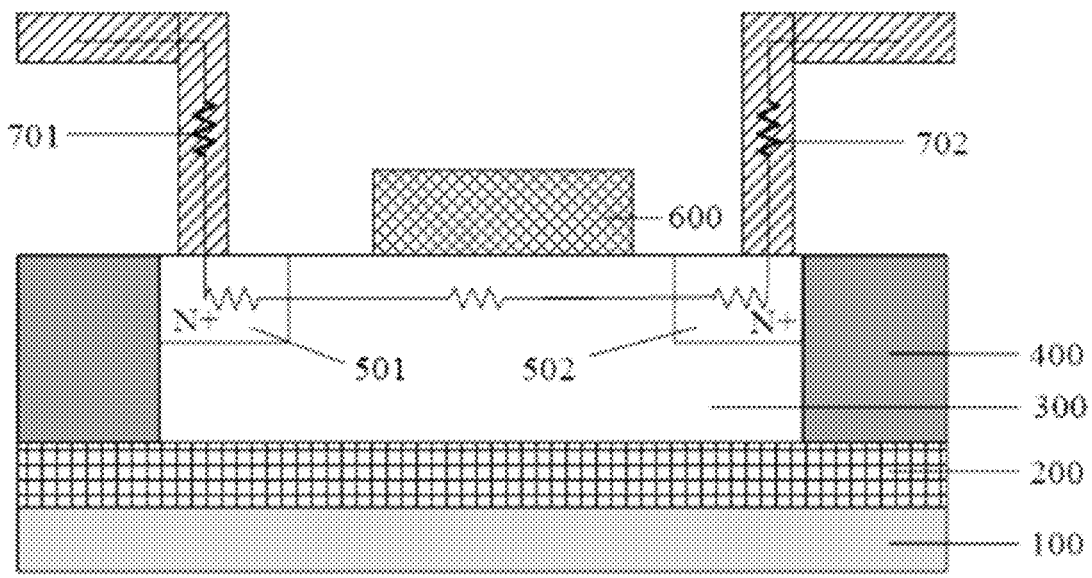
FIG. 1 is a schematic structural diagram of a semiconductor component according to an embodiment of this application.

As basic components in the manufacturing process of a semiconductor component, MOS transistors are widely used in various integrated circuits. FIG. 1 is a schematic structural diagram of a semiconductor component according to an embodiment of this application. In FIG. 1, the semiconductor component is formed based on a MOS transistor and may include: a P-substrate ($P_{sub}$) 100, a deep N-well (DNW) structure 200, a P-well ($P_{well}$) structure 300, a shallow trench isolation (STI) structure 400, an N+ injection region 501 and an N+ injection region 502, a polysilicon (poly) structure 600, a first contact resistor 701, and second contact resistor 702.

The N+ injection region 501 and the N+ injection region 502 fall into the P-well structure 300. The first contact resistor 701 is located above the N+ injection region 501 and is in an ohmic contact with the N+ injection region 501. The second contact resistor 702 is located above the N+ injection region 502 and forms an ohmic contact with the N+ injection region 502.

The N+ injection region 501 forms a source of the MOS transistor, the N+ injection region 502 forms a drain of the MOS transistor, and the polysilicon structure 600 forms a gate of the MOS transistor.

In some embodiments, when the MOS transistor is tested, electrical parameters of the MOS transistor may be extracted and modeled based on a BSIM4 test model. The BSIM4 test model is a physics-based software simulation system that is used to test the development of circuit simulation and CMOS technologies. It is accurate, upgradable, robust, and language-based. The BSIM4 test mode can provide data for the direct current analysis, instantaneous analysis, and alternating current analysis of a standard circuit.

In some embodiments, when a parameter of the MOS transistor is extracted based on the BSIM4 test model, the impact of the contact resistance may not be removed during the measurement. The resistance of the contact resistor (i.e., the contact resistance) is an important electrical characteristic of the MOS transistor. Therefore, the contact resistance of the MOS transistor may also need to be added to the parametric model. In the actual measurement process, the contact resistance may be affected by various factors, such as the ambient temperature.

To measure and extract the contact resistance more accurately, this application provides a contact resistance test and extraction method. When the MOS transistor works in a linear region, the contact resistance of the MOS transistor at a plurality of sampling temperatures are determined, and a calibration coefficient of the contact resistance at the current ambient temperature is determined. Further, the measurement result of the contact resistance is adjusted based on the calibration coefficient of the contact resistance at the current ambient temperature, to obtain an accurate contact resistance at the current ambient temperature. This method effectively eliminates the adversarial impact generated by the fluctuation of the ambient temperature and the parasitic effect of the contact resistor, thereby improving the measurement accuracy of the MOS transistor. Specific implementations are described in the following embodiments.

A MOS transistor may work in one of three working regions, which are, respectively, a fully conductive region, a cut-off region, and a linear region. When the MOS transistor works in the linear region, the MOS transistor can be equivalent to a resistor, and the total resistance of the MOS transistor is the sum of the resistance of the channel resistor (i.e., the channel resistance) and the resistance of the contact resistor (i.e., the contact resistance) of the MOS transistor.

Figure 2:
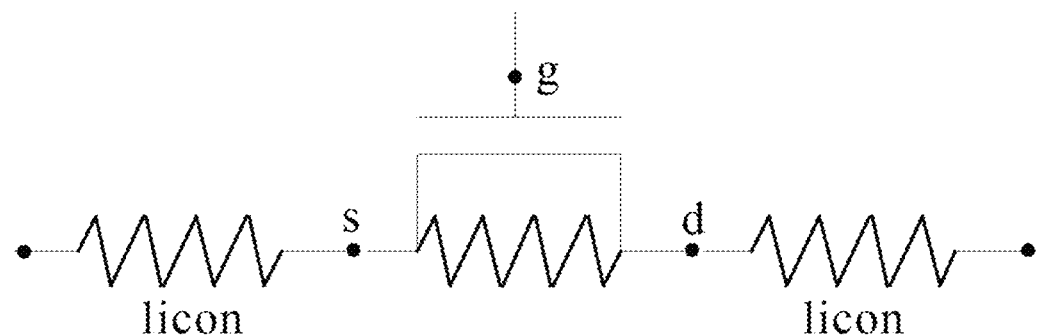
FIG. 2 is a schematic diagram of an equivalent resistor of a MOS transistor according to an embodiment of this application.

FIG. 2 is a schematic diagram of an equivalent resistor of a MOS transistor according to an embodiment of this application.

In FIG. 2, d represents the drain, s represents the source, and g represents the gate. The MOS transistor includes two contact resistors licon, one of the contact resistors licon is connected to the source s of the MOS transistor, and the other contact resistor licon is connected to the drain d.

When the MOS transistor works in the linear region, the total resistance $R_{total}$ of the MOS transistor is the sum of the channel resistance ($R_{ch}$) and the resistance of the two contact resistors licon ($R_{licon}$). That is:

$$R_{total} = R_{ch} + 2R_{licon} \quad (1)$$

Based on the characteristic of the MOS transistor, the channel resistance $R_{ch}$ may be determined by:

$$R_{ch} = \frac{V_{ds}}{I_{ds}} = \frac{L}{\mu_{eff} C_{ox} W \left(V_g - V_{on} - \frac{mV_{ds}}{2}\right)} \quad (2)$$

where $\mu_{eff}$ represents the effective mobility, $C_{ox}$ represents the effective oxide capacitor, W represents the channel width, L represents the channel length, $V_g$ represents the gate voltage, $V_{on}$ represents the threshold voltage, m represents the body effect coefficient, and $V_{ds}$ represents the voltage between the drain d and the source s.

Figure 3:
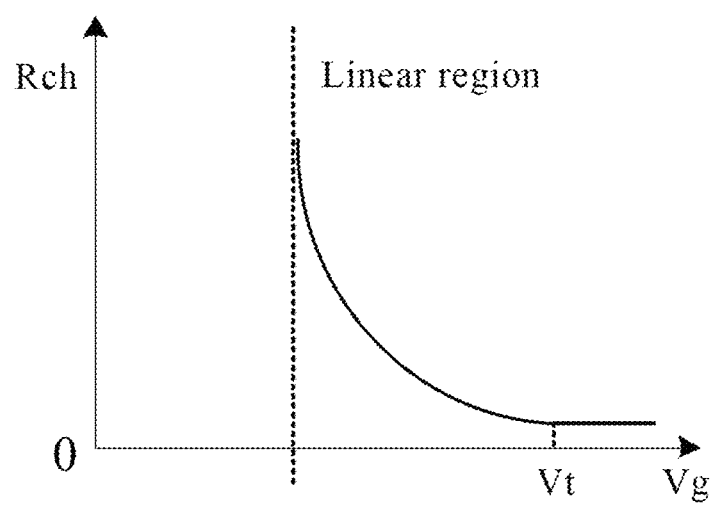
FIG. 3 is a schematic diagram of a curve representing the relationship between the gate voltage and the resistance of a channel resistor of a MOS transistor according to an embodiment of this application.

FIG. 3 is a schematic diagram of a curve representing the relationship between the gate voltage and the channel resistance of a MOS transistor according to an embodiment of this application.

As shown in FIG. 3, when the MOS transistor works in the linear region, the gate voltage $V_g$ is greater than a specific threshold (i.e., $V_t$), and the channel resistance of the MOS transistor ($R_{ch}$ in FIG. 3) is approximately a constant. That is, $$\frac{L}{\mu_{eff} C_{ox} \left( V_g - V_{on} - \frac{mV_{ds}}{2} \right)}$$

is approximately a constant. The channel resistance ($R_{ch}$) is inversely proportional to the channel width W.

In the contact resistance test method provided in the embodiments of this application, it is assumed that the MOS transistor works in the linear region and the gate voltage is greater than the specific threshold.

Figure 4:
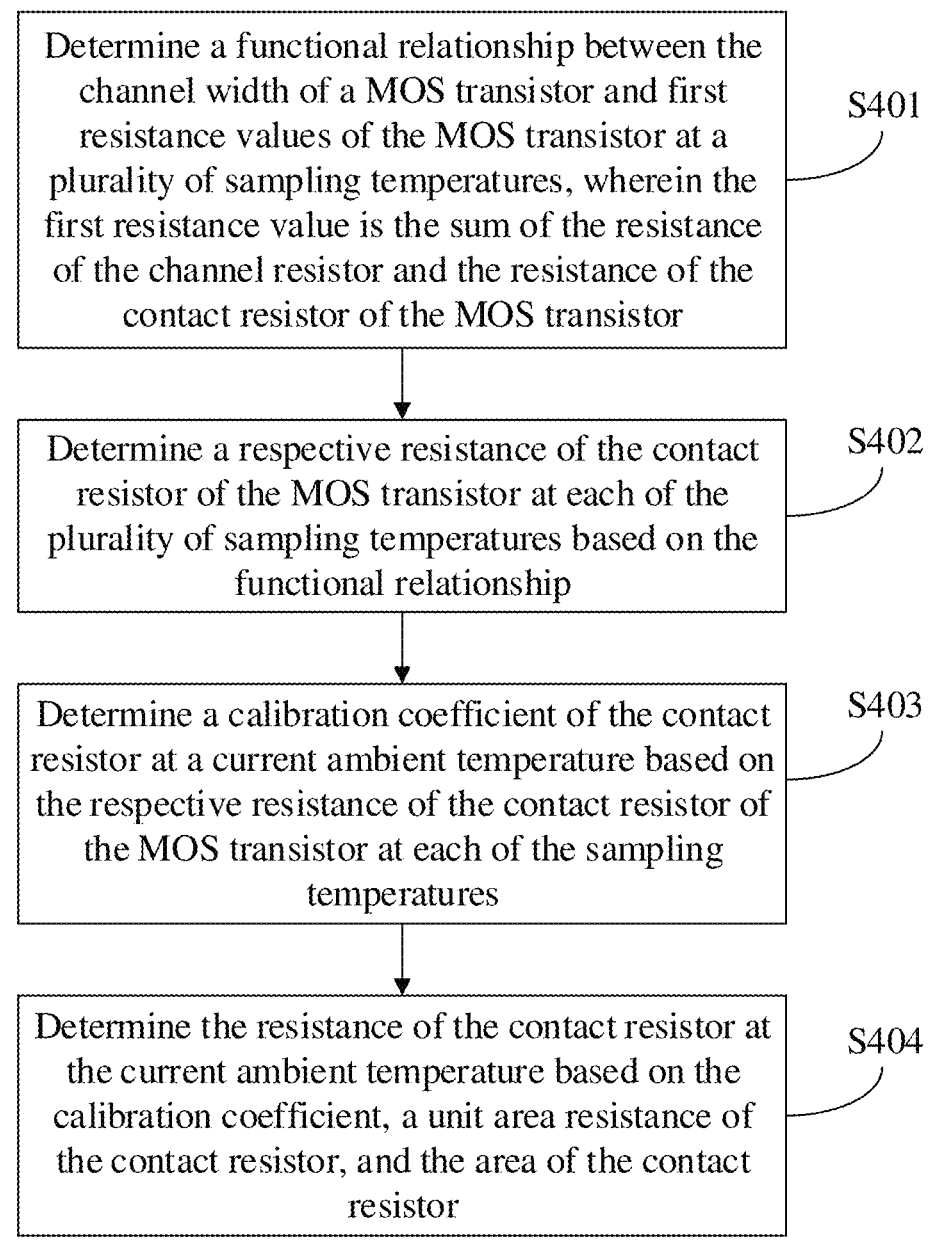
FIG. 4 is a schematic flowchart of a contact resistance test method according to an embodiment of this application.

FIG. 4 is a schematic flowchart of a contact resistance test method according to an embodiment of this application. The method can be configured to measure the contact resistance of a MOS transistor working in a linear region. In some embodiments, the method may include the following steps S401 through S404.

In step S401, a functional relationship between the channel width of the MOS transistor and a first resistance of the MOS transistor (i.e., the width-resistance relationship) at a plurality of sampling temperatures may be determined.

The first resistance is the sum of the channel resistance and the contact resistance of the MOS transistor. That is, The first resistance is the total resistance ($R_{total}$) described earlier.

In some embodiments, various MOS transistor test units (e.g., testkey) with different channel widths (device width) may be preset, and a plurality of different sampling temperatures may be set. Then, the first resistance ($R_{total}$) of the MOS transistor test units with different channel widths are separately measured at each sampling temperature, and the functional relationship between the channel width W of the MOS transistor and the first resistance ($R_{total}$) of the MOS transistor at each of the sampling temperatures is determined based on a measurement result.

In step S402, the respective contact resistance of the MOS transistor at each of the plurality of sampling temperatures may be determined based on the functional relationship.

In some embodiments, it is assumed that, at a sampling temperature $t_1$, the functional relationship between the first resistance ($R_{total1}$) of the MOS transistor and the channel width W of the MOS transistor is:

$$R_{total1} = \frac{1}{W} * x_1 + R_1 \quad (3)$$

where $x_1$ represents the resistance coefficient of the channel resistance, and may be determined by the channel widths of the MOS transistor test units with different channel widths and the first resistance at the sampling temperature $t_1$ ($R_{total1}$).

According to Equation (1), the contact resistance of the MOS transistor is unrelated to the channel width W. Therefore, based on the functional relationship, the resistance of one contact resistor Rcon of the MOS transistor at the sampling temperature $t_1$ is $$\frac{R_1}{2}.$$

Similarly, the contact resistance of the MOS transistor at the other sampling temperatures can be obtained in the same way.

In step S403, a calibration coefficient of the contact resistance at the current ambient temperature may be determined based on the respective contact resistance of the MOS transistor at each of the sampling temperatures.

In a semiconductor structure, the contact resistance is in a linear relationship with the ambient temperature of the contact resistor. The calibration coefficient may be used to represent the relationship between the resistance change amount of the contact resistance and the ambient temperature of the contact resistor. For example, the calibration coefficient may be used to indicate a relative change amount of the contact resistance when the ambient temperature of the contact resistance changes by 1° C.

In step S404, the contact resistance at the current ambient temperature is determined based on the calibration coefficient, a unit area resistance of the contact resistor, and the area of the contact resistor.

When the temperature is fixed, the resistance R of a conventional material is directly proportional to the length L of the material and inversely proportional to the area S of the material. This relationship may be represented as:

$$R = \rho \frac{L}{S},$$

where ρ represents resistivity of the material.

In some embodiments, the unit area resistance of the contact resistor can be understood as the resistance generated by the contact resistance in each unit area.

In this embodiment, the measurement result of the contact resistance may be adjusted based on the calibration coefficient of the contact resistance at the current ambient temperature. The adjustment effectively eliminates the adversarial impact generated by the fluctuation of the ambient temperature and the parasitic effect of the contact resistor, thereby improving the measurement accuracy of the MOS transistor.

Based on the content described in the foregoing embodiments, the first resistances of the MOS transistors with different channel widths at the sampling temperatures may be first separately measured, to determine the functional relationship (i.e., the width-resistance relationship) between the channel width of the MOS transistor and the first resistance of the MOS transistor at the sampling temperatures. Then, a functional curve in a preset rectangular coordinate system corresponding to the first resistances of the MOS transistor at the sampling temperatures and the channel width of the MOS transistor may be determined based on the functional relationship.

Figure 5:
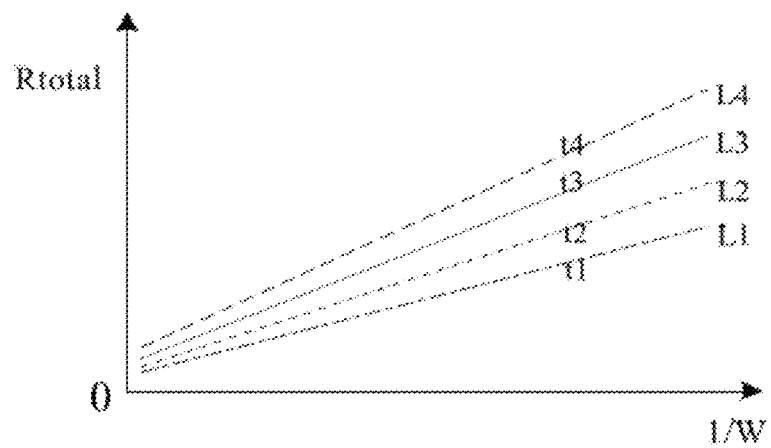
FIG. 5 is a schematic diagram of a functional curve in a rectangular coordinate system corresponding to the first resistance of a MOS transistor at sampling temperatures and the channel width of the MOS transistor according to an embodiment of this application.

FIG. 5 is a schematic diagram of a functional curve in a rectangular coordinate system corresponding to the first resistances of a MOS transistor at sampling temperatures and the channel width of the MOS transistor according to an embodiment of this application.

In FIG. 5, L1, L2, L3, and L4 are respectively functional curves in the rectangular coordinate system that correspond to the first resistance ($R_{total}$) of the MOS transistor at four different sampling temperatures t1, t2, t3, and t4 and the channel width W of the MOS transistor.

The functional relationship between the first resistance ($R_{total}$) of the MOS transistor and the channel width W of the MOS transistor may be expressed as:

$$R_{total} = \frac{1}{W} * x + 2R_{licon} \quad (4)$$

Therefore, the intercepts of the functional curves L1, L2, L3, and L4 in a vertical axis of the rectangular coordinate system may be determined as the contact resistance of the MOS transistor at the sampling temperatures t1, t2, t3, and t4. In other words, the values of $2R_{licon}$ at the sampling temperatures t1, t2, t3, and t4 can be determined based on the functional relationship. x in Equation (4) is a constant and may be determined based on slopes of the functional curves L1, L2, L3, and L4 at the sampling temperatures.

In some embodiments, after the contact resistance of the MOS transistor at the sampling temperatures are determined, the resistance-temperature parameter between the contact resistance and the temperature is determined based on the sampling temperatures and the contact resistance of the MOS transistor at the sampling temperatures.

For example, assuming that tc represents the resistance-temperature parameter, and tx represents the sampling temperature, a relationship between the contact resistance R and tc and tx (i.e., the temperature-resistance relationship) may be represented by an n-order function with one to-be-determined variable, for example:

$$R=tc \times tx+C \quad (5)$$

where C is a preset coefficient.

In some embodiments, the sampling temperatures and the contact resistance of the MOS transistor at the sampling temperatures are input to the n-order function with one to-be-determined variable, to obtain several points in the rectangular coordinate system, and an optimal value of the resistance-temperature parameter tc can be obtained through curve fitting.

Figure 6:
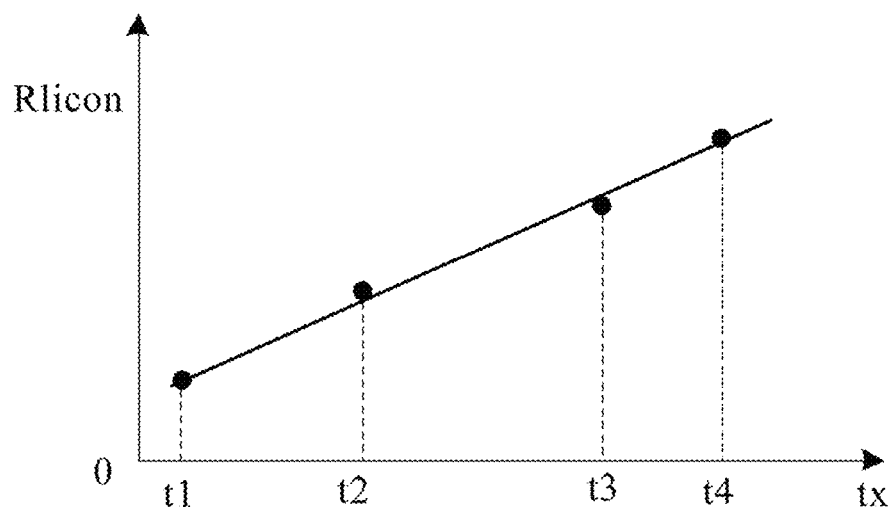
FIG. 6 is a schematic diagram of a functional curve in a rectangular coordinate system corresponding to sampling temperatures and the contact resistance of a MOS transistor at the sampling temperatures according to an embodiment of this application.

FIG. 6 is a schematic diagram of a functional curve in a rectangular coordinate system corresponding to sampling temperatures and corresponding contact resistance of a MOS transistor at these sampling temperatures according to an embodiment of this application.

Optionally, curve fitting may be performed on the n-order function with one to-be-determined variable by using the least-square fitting method, or using existing software such as Matlab. A specific curve fitting manner is not limited in this application.

In some embodiments, after the resistance-temperature parameter is determined, the calibration coefficient of the contact resistance at the current ambient temperature can be calculated based on a preset standard temperature, the current ambient temperature, and the resistance-temperature parameter.

The calibration coefficient $R_t$ of the contact resistance at the current ambient temperature may be determined by:

$$R_t=1+(T_e-T_n) \times T_c \quad (6)$$

where $T_e$ represents the current ambient temperature. $T_n$ represents the standard temperature. The standard temperature is set to standardize a measurement condition to allow the comparison between different groups of data. Optionally, an internationally recognized value referenced by existing measurement models may be selected as the standard temperature. For example, the standard temperature may be the melting temperature of ice, 0° C. (273.15K). $T_c$ represents the resistance-temperature parameter. In this application, conventional temperature measurement manners may be used to detect the ambient temperature of the current measurement environment.

In some embodiments, the contact resistor may include a first contact resistor and a second contact resistor, the first contact resistor is connected to the drain of the MOS transistor, and the second contact resistor is connected to the source of the MOS transistor.

In some embodiments, after the calibration coefficient of the contact resistance at the current ambient temperature is determined, the contact resistance at the current ambient temperature can be calculated based on the calibration coefficient, the unit area resistance of the contact resistor at the standard temperature, and the area of a first contact resistor. For example, the resistance of the first contact resistor (i.e., the first contact resistance) at the current ambient temperature ($R_{dc}$) is calculated by:

$$R_{dc} = R_c \times R_t \times \frac{1}{S_1} \quad (7)$$

The resistance of a second contact resistor (i.e., the second contact resistance) at the current ambient temperature ($R_{sc}$) is calculated by:

$$R_{sc} = R_c \times R_t \times \frac{1}{S_2} \quad (8)$$

where $R_c$ represents the unit area resistance of the contact resistor at the standard temperature, $R_t$ represents the calibration coefficient, $S_1$ represents the area of the first contact resistor, and $S_2$ represents the area of the second contact resistor.

In some embodiments, the contact structure of the MOS transistor may be connected to a plurality of metal conducting wires. Under these circumstances, $S_1$ and $S_2$ may be determined by: $S_1=N_1 \times S'_1$, $S_2=N_2 \times S'_2$, respectively. $N_1$ and $N_2$ represent the numbers of metal conducting wires connected to the first contact resistor and the second contact resistor, respectively. $S_1'$ and $S_2'$ represent the areas of individual metal conducting wires connected to the first contact resistor and the second contact resistor, respectively.

According to the contact resistance test method provided in this application, when the contact resistance of the MOS transistor working in the linear region is measured, a measurement result of the contact resistance may be adjusted based on the calibration coefficient of the contact resistance at the current ambient temperature, to obtain an accurate resistance of the contact resistance at the current ambient temperature. This method effectively eliminates the adversarial impact generated by the fluctuation of the ambient temperature and the parasitic effect of the contact resistor, thereby improving the measurement accuracy of the MOS transistor.

In some embodiments, the above-described contact resistance test method may be used in a method for simulating a semiconductor device. In some embodiments, the method for simulating a semiconductor device may including the following steps: determining the temperature-resistance relationship between the contact resistance of the semiconductor device and the temperature; determining, based on the temperature-resistance relationship, the sampling contact resistance of the semiconductor device at the sampling temperature; and simulating the semiconductor device at the sampling temperature by adding a resistor comprising the sampling contact resistance to a simulation model. Detail implementations of these steps may be the same as those described in the foregoing embodiments, and thus will not be repeatedly described herein for the sake of conciseness. Specifically, the above-described contact resistance test method may be used in the step of determining the temperature-resistance relationship between the contact resistance of the semiconductor device and the temperature.

In some embodiments, the simulation model may be a SPICE simulation model (i.e., the SPICE model), and the semiconductor device may be a MOS transistor. Apparently, this specification is not limited herein. This method may be applicable to any other well-known simulation model, and the semiconductor device may be other transistor or device.

Figure 7:
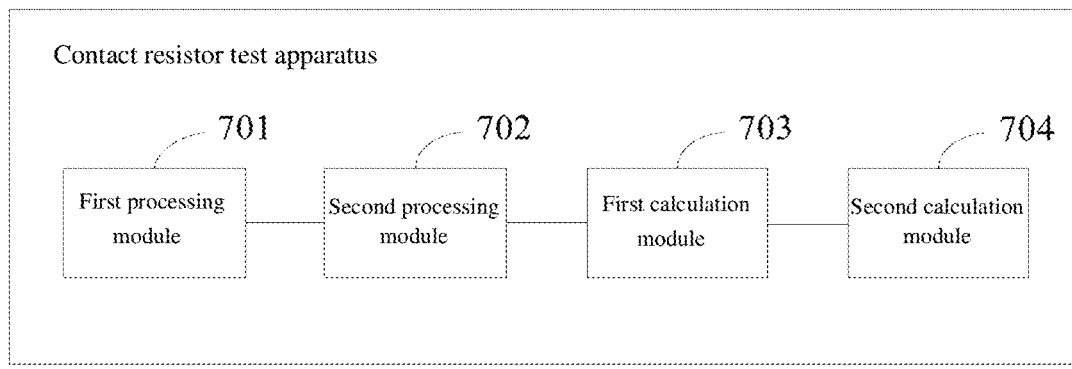
FIG. 7 is a schematic diagram of a program module of a contact resistance test apparatus according to an embodiment of this application.

Based on the content described in the foregoing embodiments, FIG. 7 shows a schematic diagram of a program module of a contact resistance test apparatus according to an embodiment of this application. The apparatus is configured to measure the contact resistance of a MOS transistor working in a linear region.

In some embodiments, the contact resistance measurement apparatus may include a first processing module 701, a second processing module 702, a first calculation module 703, and a second calculation module 704.

The first processing module 701 may be configured to determine a functional relationship between the channel width of the MOS transistor and first resistances of the MOS transistor at a plurality of sampling temperatures, wherein the first resistance is the sum of the resistance of the channel resistor (i.e., the channel resistance) and the resistance of the contact resistor (i.e., the contact resistance) of the MOS transistor.

The second processing module 702 may be configured to determine the respective contact resistance of the MOS transistor at each of the plurality of sampling temperatures based on the functional relationship.

The first calculation module 703 may be configured to determine a calibration coefficient of the contact resistance at a current ambient temperature based on the respective contact resistance of the MOS transistor at each of the plurality of sampling temperatures.

The second calculation module 704 may be configured to determine the current contact resistance at the current ambient temperature based on the calibration coefficient, the unit area resistance of the contact resistor, and the area of the contact resistor.

According to the contact resistance test apparatus provided in this application, when the contact resistance of the MOS transistor working in the linear region is measured, the functional relationship between the channel width of the MOS transistor and the first resistances of the MOS transistor at the sampling temperatures is determined, to determine the contact resistance of the MOS transistor at the sampling temperatures. The calibration coefficient of the contact resistance at the current ambient temperature is determined based on the contact resistance of the MOS transistor at the sampling temperatures. A measurement result of the contact resistance is further adjusted based on the calibration coefficient of the contact resistance at the current ambient temperature, to obtain an accurate contact resistance at the current ambient temperature, which effectively eliminates the adversarial impact generated by the fluctuation of the ambient temperature and the parasitic effect of the contact resistor, thereby improving the measurement accuracy of the MOS transistor.

In some embodiments, the first processing module 701 may be configured to: separately measure the respective first resistance of the MOS transistor at each of the plurality of sampling temperatures at each of a plurality of channel widths; and determine, based on the respective first resistance of the MOS transistor at each of the plurality of sampling temperatures at each of the plurality of channel widths, the functional relationship between the channel width of the MOS transistor and the first resistances of the MOS transistor at the sampling temperatures.

In some embodiments, the second processing module 702 may be further configured to: determine, based on the functional relationship, a functional curve in a preset rectangular coordinate system corresponding to the first resistances of the MOS transistor at the sampling temperatures and the channel width of the MOS transistor; and determine the respective contact resistance of the MOS transistor at each of the plurality of sampling temperatures based on an intercept of each of the functional curves, where the contact resistance of the MOS transistor is unrelated to the channel width of the MOS transistor.

In some embodiments, the first calculation module 703 may be further configured to: determine the resistance-temperature parameter between the contact resistance and a temperature based on the sampling temperatures and the respective contact resistance of the MOS transistor at each of the plurality of sampling temperatures; and obtain the calibration coefficient of the contact resistance at the current ambient temperature based on a preset standard temperature, the current ambient temperature, and the resistance-temperature parameter.

In some embodiments, the first calculation module 703 may be further configured to: obtain the calibration coefficient Rt of the contact resistance at the current ambient temperature by:

$$R_t = 1 + (T_e - T_n) \times T_c \qquad (9)$$

where $T_e$ represents the current ambient temperature, $T_n$ represents the standard temperature, and $T_c$ represents the resistance-temperature parameter.

In some embodiments, the contact resistor includes a first contact resistor and a second contact resistor, the first contact resistor is connected to the drain of the MOS transistor, and the second contact resistor is connected to the source of the MOS transistor.

The second calculation module 704 may be further configured to: determine a first target resistance of the first contact resistor at the current ambient temperature based on the calibration coefficient, the unit area resistance of the contact resistor at the standard temperature, and the area of the first contact resistor; and determine a second target resistance of the second contact resistor at the current ambient temperature based on the calibration coefficient, the unit area resistance of the contact resistor at the standard temperature, and the area of the second contact resistor.

In some embodiments, the second calculation module 704 may be configured to: determine the first target resistance ($R_{dc}$) by:

$$R_{dc} = R_c \times R_t \times \frac{1}{S_1} \quad (10)$$

and determine the second target resistance ($R_{sc}$) by:

$$R_{sc} = R_c \times R_t \times \frac{1}{S_2} \quad (11)$$

where $R_c$ represents the unit area resistance of the contact resistor at the standard temperature, $R_t$ represents the calibration coefficient, $S_1$ represents the area of the first contact resistor, and $S_2$ represents the area of the second contact resistor.

The functions implemented by the function modules in the contact resistance test apparatus correspond to the steps in the contact resistance test method described in the foregoing embodiments. Therefore, the steps in the contact resistance test method described in the foregoing embodiment may be referred to for a detailed implementation process of the function modules in the contact resistance test apparatus, details of which are not described herein again.

Based on the content described in the foregoing embodiments, this application further provides an electronic device. The electronic device may include at least one processor and a memory. The memory may store computer-executable instructions. Upon being executed by the at least one processor, the computer execution instructions may cause the at least one processor to perform the contact resistance test method described in the foregoing embodiments. Details are not described herein again in this embodiment.

Based on the content described in the foregoing embodiments, this application further provides a computer-readable storage medium. The computer-readable storage medium stores computer-executable instructions. When a processor executes the computer-executable instructions, the contact resistance test method described in the foregoing embodiments is implemented.

Based on the content described in the foregoing embodiments, this application further provides a computer program product. The computer program product includes a computer program. When the computer program is executed by a processor, the contact resistance test method described in the foregoing embodiments can be implemented.

In the embodiments provided in this application, it should be understood that the disclosed device and method can be implemented in other manners, and the described device embodiments are merely examples. For example, the separation of the modules is performed by their logical functions. In actual implementation, there may be other manners to separate the modules. For example, a plurality of modules may be combined or integrated into another system, or some features may be omitted or not performed. In addition, the displayed or discussed mutual couplings or direct couplings or communication connections may be implemented by using some interfaces. The indirect couplings or communication connections between the apparatuses or modules may be implemented in electronic, mechanical, or other forms.

The modules described as separate parts may or may not be physically separate, and parts displayed as modules may or may not be physical units, may be located in one place, or may be distributed in a plurality of network units. Some or all of the modules may be selected based on an actual requirement to implement the objectives of the solutions in the embodiments.

In addition, the function modules in the embodiments of this application may be integrated into one processing unit, or each of the modules may exist separately physically, or two or more modules may be integrated into one unit. The unit integrated by the modules may be implemented in a form of hardware, or may be implemented in a form of hardware plus a software function unit.

The integrated module implemented in a form of a software function module may be stored in a computer-readable storage medium. The software function module is stored in a storage medium and includes several instructions for instructing a computer device (which may be a personal computer, a server, a network device, or the like) or a processor to perform some of the steps of the methods described in the embodiments of this application.

It should be understood that the processor may be a Central Processing Unit (CPU), or may be another general-purpose processor, a Digital Signal Processor (DSP), an Application Specific Integrated Circuit (ASIC), or the like. The general-purpose processor may be a microprocessor, or the processor may be any conventional processor or the like. The steps of the methods disclosed with reference to this application may be directly performed by a hardware processor, or may be performed by using a combination of hardware and software modules in the processor.

The memory may include a high-speed RAM memory; or may include a non-volatile memory NVM, for example, at least one magnetic disk memory; or may be a USB flash drive, a removable hard disk, a read-only memory, a magnetic disk, an optical disc, or the like.

The bus may be an Industry Standard Architecture (ISA) bus, a Peripheral Component Interconnect (PCI) bus, an Extended Industry Standard Architecture (EISA) bus, or the like. The bus may be classified into an address bus, a data bus, a control bus, and the like. For ease of representation, the bus in the accompanying drawings of this application is not limited to only one bus or one type of bus.

The foregoing storage medium may be implemented by any type of volatile or non-volatile storage device or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc. The storage medium may be any available medium accessible to a general-purpose or dedicated computer.

An example storage medium is coupled to the processor, so that the processor can read information from the storage medium and can write information into the storage medium. Certainly, the storage medium may be a component of the processor. The processor and the storage medium may be located in an Application Specific Integrated Circuits (ASIC). Certainly, the processor and the storage medium may alternatively exist as discrete components in an electronic device or a main control device.

A person of ordinary skill in the art can understand that all or some of the steps in the foregoing method embodiments may be implemented by a program instructing related hardware. The program may be stored in a computer-readable storage medium. When the program is executed, the steps in the foregoing method embodiments are performed. The foregoing storage medium includes any medium that can store program code, such as a ROM, a RAM, a magnetic disk, or an optical disc.

Finally, it should be noted that the foregoing embodiments are merely used to describe the technical solutions of this application, but are not limited thereto. Although this application is described in detail with reference to the foregoing embodiments, a person of ordinary skill in the art should understand that the technical solutions recorded in the foregoing embodiments may still be modified, or equivalently replace some or all technical features. However, these modifications or replacements do not make the essence of the corresponding technical solutions go beyond the scope of the technical solutions of the embodiments of this application.

What is claimed is:

1. A method for simulating a semiconductor device, the method comprises:
   determining a temperature-resistance relationship between a contact resistance of the semiconductor device and a temperature;
   determining, based on the temperature-resistance relationship, a sampling contact resistance of the semiconductor device at a sampling temperature;
   simulating the semiconductor device at the sampling temperature by adding a resistor comprising the sampling contact resistance to a simulation model.

2. The method of claim 1, wherein the simulation model is a SPICE model.

3. The method of claim 1, wherein the semiconductor device is a MOS transistor.

4. The method of claim 3, wherein the determining a temperature-resistance relationship between a contact resistance of the semiconductor device and a temperature comprises:
   determining a width-resistance relationship between a channel width of the MOS transistor and first resistances of the MOS transistor at a plurality of ambient temperatures, wherein the first resistance is the sum of a channel resistance and a contact resistance of the MOS transistor, the channel resistance is a resistance of a channel resistor of the MOS transistor, the contact resistance is a resistance of a contact resistor of the MOS transistor;
   determining, based on the width-resistance relationship, a respective contact resistance of the MOS transistor at each of the plurality of ambient temperatures; and
   determining, based on the respective contact resistance of the MOS transistor at each of the plurality of ambient temperatures, a calibration coefficient of the contact resistance at the sampling temperature, and wherein
   the determining, based on the temperature-resistance relationship, a sampling contact resistance of the semiconductor device at a sampling temperature comprises:
   determining the sampling contact resistance at the sampling temperature based on the calibration coefficient, a unit area resistance of the contact resistor, and an area of the contact resistor.

5. The method of claim 4, wherein the determining a width-resistance relationship between a channel width of the MOS transistor and first resistances of the MOS transistor at a plurality of ambient temperatures comprises:
   measuring, at each of a plurality of channel widths, the respective first resistance of the MOS transistor at each of the plurality of ambient temperatures; and
   determining, based on the respective first resistance of the MOS transistor at each of the plurality of ambient temperatures and at each of the plurality of channel widths, the width-resistance relationship between the channel width of the MOS transistor and the first resistances of the MOS transistor at the plurality of ambient temperatures.

6. The method of claim 4, wherein the determining, based on the width-resistance relationship, a respective contact resistance of the MOS transistor at each of the plurality of ambient temperatures comprises:
   determining, based on the width-resistance relationship and at each of the plurality of ambient temperatures, a respective functional curve in a preset rectangular coordinate system corresponding to the first resistance of the MOS transistor and the channel width of the MOS transistor; and
   determining, based on an intercept of each of the functional curves, the respective contact resistance of the MOS transistor at each of the plurality of ambient temperatures, wherein the contact resistance of the MOS transistor is unrelated to the channel width of the MOS transistor.

7. The method of claim 4, wherein the determining, based on the respective contact resistance of the MOS transistor at each of the plurality of ambient temperatures, a calibration coefficient of the contact resistance at the sampling temperature comprises:
   determining a resistance-temperature parameter between the contact resistance and a temperature based on the plurality of ambient temperatures and the respective contact resistance of the MOS transistor at each of the plurality of ambient temperatures; and
   obtaining the calibration coefficient of the contact resistance at the sampling temperature based on a preset standard temperature, the sampling temperature, and the resistance-temperature parameter.

8. The method of claim 7, wherein the calibration coefficient $R_t$ of the contact resistance at the sampling temperature is obtained by:

$$R_t = 1 + (T_e - T_n) \times T_c$$

wherein $T_e$ represents the sampling temperature, $T_n$ represents the standard temperature, and $T_c$ represents the resistance-temperature parameter.

9. The method of claim 8, wherein the contact resistor comprises a first contact resistor and a second contact resistor, the first contact resistor is connected to a drain of the MOS transistor, and the second contact resistor is connected to a source of the MOS transistor; and
   the determining the sampling contact resistance at the sampling temperature based on the calibration coefficient, a unit area resistance of the contact resistor, and an area of the contact resistor comprises:
   determining a first target contact resistance of the first contact resistor at the sampling temperature based on the calibration coefficient, a unit area resistance of the contact resistor at the preset standard temperature, and an area of the first contact resistor; and
   determining a second target contact resistance of the second contact resistor at the sampling temperature based on the calibration coefficient, the unit area resistance of the contact resistor at the preset standard temperature, and an area of the second contact resistor.

10. The method of claim 9, wherein the first target contact resistance $R_{dc}$ is determined by:

$$R_{dc} = R_c \times R_t \times \frac{1}{S_1},$$

and the second target contact resistance $R_{sc}$ is determined by:

$$R_{sc} = R_c \times R_t \times \frac{1}{S_2},$$

wherein $R_c$ represents the unit area resistance of the contact resistor at the preset standard temperature, $R_t$ represents the calibration coefficient, $S_1$ represents the area of the first contact resistor, and $S_2$ represents the area of the second contact resistor.

11. A non-transitory computer-readable storage medium, wherein the computer-readable storage medium stores computer-executable instructions, and wherein, upon being executed by a processor, the computer-executable instructions implement the method of claim 1.

12. A non-transitory computer program product, comprising a computer program, wherein, upon being executed by a processor, the computer program implements the method of claim 1.

13. A device for simulating a semiconductor device, the device comprising a processor and memory configured with computer-executable instructions, wherein upon being executed by the processor, the computer-executable instructions cause the processor to perform operations, comprising:
    determining a temperature-resistance relationship between a contact resistance of the semiconductor device and a temperature;
    determining, based on the temperature-resistance relationship, a sampling contact resistance of the semiconductor device at a sampling temperature;
    simulating the semiconductor device at the sampling temperature by adding a resistor comprising the sampling contact resistance to a simulation model.

14. The device of claim 13, wherein the simulation model is a SPICE model.

15. The device of claim 13, wherein the semiconductor device is a MOS transistor.

16. The device of claim 15, wherein the determining a temperature-resistance relationship between a contact resistance of the semiconductor device and a temperature comprises:
    determining a width-resistance relationship between a channel width of the MOS transistor and first resistances of the MOS transistor at a plurality of ambient temperatures, wherein the first resistance is the sum of a channel resistance and the contact resistance of the MOS transistor, the channel resistance is a resistance of a channel resistor of the MOS transistor, the contact resistance is a resistance of a contact resistor of the MOS transistor;
    determining, based on the width-resistance relationship, a respective contact resistance of the MOS transistor at each of the plurality of ambient temperatures; and
    determining, based on the respective contact resistance of the MOS transistor at each of the plurality of ambient temperatures, a calibration coefficient of the contact resistance at the sampling temperature, and wherein
    the determining, based on the temperature-resistance relationship, a sampling contact resistance of the semiconductor device at a sampling temperature comprises:
    determining the sampling contact resistance at the sampling temperature based on the calibration coefficient, a unit area resistance of the contact resistor, and an area of the contact resistor.

17. The device of claim 16, wherein the determining a width-resistance relationship between a channel width of the MOS transistor and first resistances of the MOS transistor at a plurality of ambient temperatures comprises:
    measuring, at each of a plurality of channel widths, the respective first resistance of the MOS transistor at each of the plurality of ambient temperatures; and
    determining, based on the respective first resistance of the MOS transistor at each of the plurality of ambient temperatures and at each of the plurality of channel widths, the width-resistance relationship between the channel width of the MOS transistor and the first resistances of the MOS transistor at the plurality of ambient temperatures.

18. The device of claim 16, wherein the determining, based on the width-resistance relationship, a respective contact resistance of the MOS transistor at each of the plurality of ambient temperatures comprises:
    determining, based on the width-resistance relationship and at each of the plurality of ambient temperatures, a respective functional curve in a preset rectangular coordinate system corresponding to the first resistance of the MOS transistor and the channel width of the MOS transistor; and
    determining, based on an intercept of each of the functional curves, the respective contact resistance of the MOS transistor at each of the plurality of ambient temperatures, wherein the contact resistance of the MOS transistor is unrelated to the channel width of the MOS transistor.

19. The device of claim 16, wherein the determining, based on the respective contact resistance of the MOS transistor at each of the plurality of ambient temperatures, a calibration coefficient of the contact resistance at the sampling temperature comprises:
    determining a resistance-temperature parameter between the contact resistance and a temperature based on the plurality of ambient temperatures and the respective contact resistance of the MOS transistor at each of the plurality of ambient temperatures; and
    obtaining the calibration coefficient of the contact resistance at the sampling temperature based on a preset standard temperature, the sampling temperature, and the resistance-temperature parameter.

20. The device of claim 19, wherein the calibration coefficient $R_t$ of the contact resistance at the sampling temperature is obtained by:

$$R_t = 1 + (T_e - T_n) \times T_c$$

wherein $T_e$ represents the sampling temperature, $T_n$ represents the standard temperature, and $T_c$ represents the resistance-temperature parameter.

* * * * *